July 7, 1970 R. M. ASHBY 3,519,890
LOW STRESS LEAD
Filed April 1, 1968
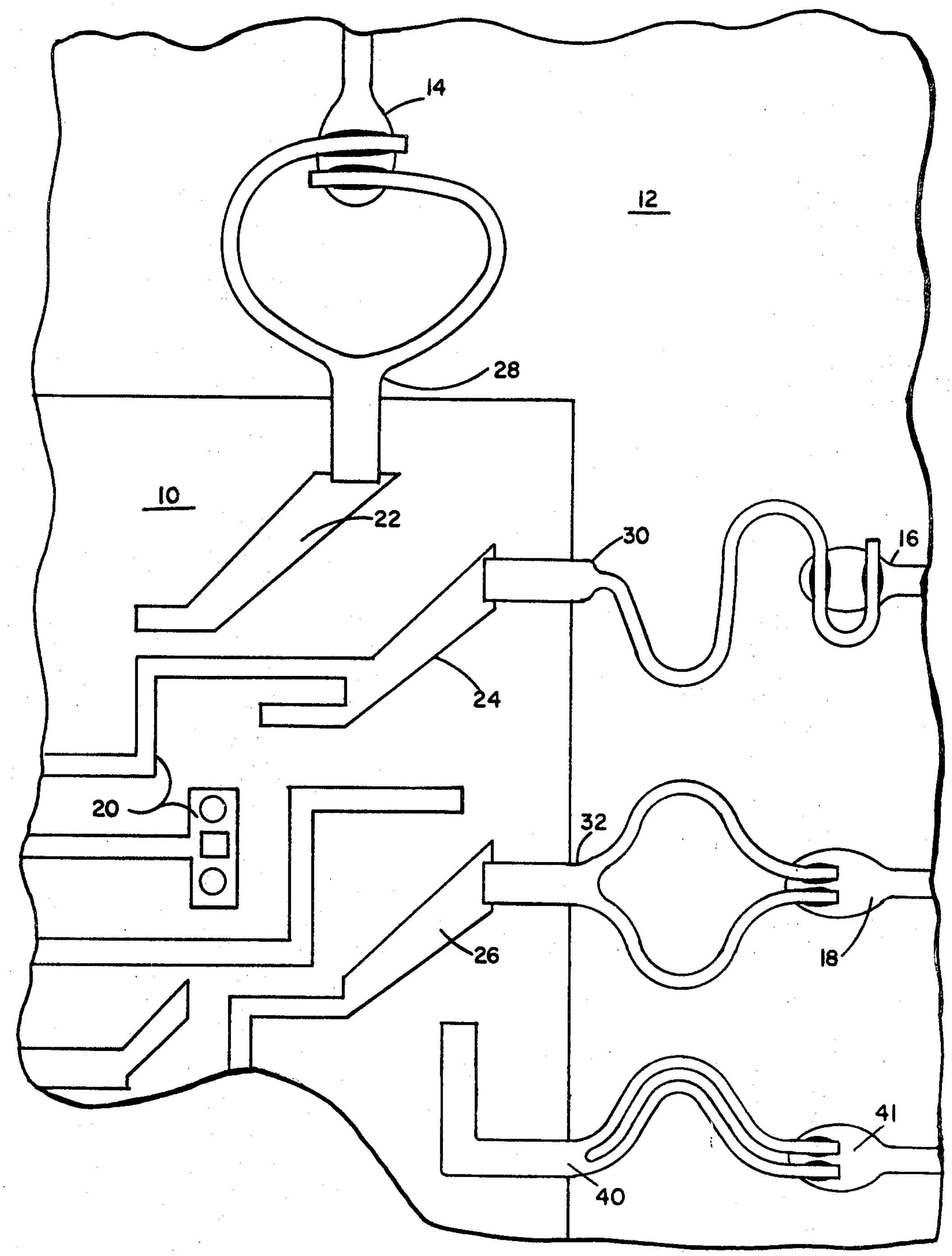
INVENTOR.
ROBERT M. ASHBY
BY *Wallace B. King*
ATTORNEY United States Patent Office 3,519,890

Patented July 7, 1970

3,519,890
LOW STRESS LEAD
Robert M. Ashby, Pasadena, Calif., assignor to North American Rockwell Corporation
Filed Apr. 1, 1968, Ser. No. 717,541
Int. Cl. H05k 3/30
U.S. Cl. 317—101 4 Claims

ABSTRACT OF THE DISCLOSURE

A microelectronic circuit, interconnecting lead, integrally formed upon a circuit containing die with a protruding portion extending beyond the edge of said die, and imposing a minimum of stress upon said die during bonding operations and thereafter. The geometric shape of said protruding portion being fashioned in a predetermined meandering line. The protruding portion is adapted to form single or multiple bonds with a circuit lead or a substrate bonding pad.

BACKGROUND OF THE INVENTION

Field of the invention

The invention relates to apparatus for interconnecting microelectronic circuit containing dice with a substrate and more particularly to beam leads having a meander-line geometric shape for substantially minimizing the stress level imposed upon a die.

Description of the prior art

In the past, the bonding of a silicon chip or die to a substrate began by attaching the chip to a gold plated header by means of a gold-silicon eutectic bond. The chip contacts were then connected to the header leads by bonding gold wires thereto (two bonding steps). This method involves a large number of individual bonds each representing a potentail source of failure.

Subsequently, a technique was devised to reduce the number of bonds and increase the reliability factor. So called "beam leads" represent an improved means of interconnecting microelectronic chips or dice to a substrate. Prior art beams leads (see Western Electric's The Engineer, December 1967, pages 16–26) are formed (deposited) on the chip as an integral part thereof, thus eliminating the operation of bonding to the chip. The beam leads are bonded directly to a substrate pad.

A problem which has been encountered with beam leads involves the buckling of the beam leads while under bonding pressure, or subsequently due to differential thermal conditions and temperature cycling, which buckling causes the silicon chip to raise from the substrate surface. Even if sufficient stress to cause buckling of the chip is not imposed thereon, slightly lower stress levels may still be detrimental. It has been observed that silicon chips are stress sensitive and that stress may cause variations in the electrical characteristics of the circuits formed thereon. By redesigning the beam lead according to the present invention, the above-described problem is solved by substantially eliminating the stress imposed by the beam lead upon the silicon chip.

SUMMARY OF THE INVENTION

In accordance with the present invention there is set forth a microelectronic circuit, interconnecting lead, commonly called a beam lead, which is attached to a silicon chip or die. The beam lead protrudes beyond the edge of the chip in a meandering manner, and is adapted for bonding to another circuit lead or a pad on a substrate surface. The bonded beam lead provides an interconnecting structure with a high degree of mechanical compliance. In other words a negligible amount of stress is imposed through the beam lead upon the chip. Further, a beam lead fashioned after the manner of this invention is adapted to be separately bonded two or more times to the same circuit lead or substrate pad. Redundant bonded connections thus provide added reliability to the system.

OBJECTS

It is therefore an object of the present invention to provide an improved microelectronic circuit lead.

Another object of the present invention is to provide a beam lead which substantially eliminates any stress transfer through the beam lead to a silicon chip or die.

A further object of this invention is to provide a beam lead with a protruding portion having a meandering shape.

A still further object of the present invention is to provide a beam lead which is adapted to be separately and multiply bonded to a substrate pad or other circuit lead.

Still other objects, features, and attendant advantages of the present invention will become apparent to those skilled in the art from a reading of the following detailed description of several embodiments constructed in accordance therewith, taken in conjunction with the accompanying drawing.

BRIEF DESCRIPTION OF THE DRAWING

The figure illustrates a portion of a silicon chip bonded to section of substrate material. A variety of beam leads designed in accordance with the present invention are shown bonded to pads located on the substrate.

DESCRIPTION OF THE PREFERRED EMBODIMENTS

Referring now to the figure, there is shown a portion of a silicon chip 10 which is bonded to a substrate 12, a section of which is shown containing four bonding pads 14, 16, 18 and 41. The silicon chip 10 contains an integrated circuit 20 (only a small portion of which is represented) with conducting paths 22, 24, and 26. Deposited upon chip 10 are four beam leads 28, 30, 32 and 40, each of which is a different example of the meandering geometric shape into which the protruding portions thereof may be formed. The beam leads may be composed of a noble metal, such as gold, or other commonly used conducting materials, such as aluminum.

Beam lead 28 divides into two arcs which intersect bonding pad 14 on substrate 12. Each bifurcated portion of lead 28 meanders in an opposite direction which is parallel to the plane of the chip. Each portion of lead 28 ultimately meanders to the same pad 14. Two separate bonds may be formed between pad 14 and beam lead 28. The bonding operation may involve the use of a number of common methods including compression bonding, ultrasonic bonding, thermal bonding, and solder reflow bonding. In a similar manner beam lead 32 divides into two meandering-line portions which intersect with bonding pad 18. Again two separate bonded connections are obtained for lead 32. Beam lead 30 is formed into a wave-like shape which meanders across bonding pad 16 twice, and is bonded at each crossing. With a beam lead shaped like lead 30, more than two bonded connections would be obtainable if it were found to be necessary and practicable. The advantage of having redundant connections is an increase in the overall reliability of the system incorporating such components, since the circuit will continue to function despite a break in one of the bonds. Beam lead 40 is bifurcated with the two parts which are parallel to each other and also parallel to the plane of the chip. One bond to bonding pad 41 is made for each of the two parts of lead 40.

Clearly the protruding portions of the beam leads just described are not the only practical shapes which one might design. Many other shapes may come to mind, and one example not shown would be a bifurcated beam lead the individual portions of which meander in a substantially parallel manner. Such a design would have space saving advantages where separate chips are bonded in proximity, with the leads of one chip alternately spaced between the leads of the other chip.

The significant feature of a beam lead shaped like or similar to leads 28, 30, 32 and 40 is that there is a high degree of mechanical compliance associated therewith. In other words, if any stress is exerted upon, or generated within the beam lead, such stress will not be transferred in any substantial or potentially damaging amount to the silicon chip 10. Stress often results from the application of force upon the leads while they are being bonded to the pads, or from differential thermal conditions which may occur during operation of the circuits. In either event, where a straight short beam lead is utilized, there is a relatively low degree of mechanical compliance, and the stresses described above may be sufficient to cause silicon chip 10 to buckle or raise up from the substrate surface. In such a position, vibrational forces would cause the chip to sever the bonded interconnections with the substrate. Even if buckling did not occur, undesirable effects may result due to the stress sensitivity of the circuits on the chip where leads having low mechanical compliance are used.

Although the invention has been described in detail, it is to be understood that the same is by way of illustration and example only, and is not to be taken by way of limitation.

What is claimed is:

1. In a microelectronic circuit containing a chip, interconnecting means comprising:

a beam lead attached to said chip, said lead extending outwardly from said chip in a wave-like fashion, parallel to the plane of the chip, said lead connected to an electrical connection element along at least two separate points to produce a low level of stress upon said chip when in a connected condition.

2. Microelectronic circuit electrical interconnection elements comprising:

a microelectronic circuit element, a connecting lead attached to a microelectronic chip, and a bifurcated extension of said lead with one part of said bifurcation arced in one direction and the other part of said bufurcation arced in an opposite direction, with the arcs being parallel to the plane of the chip and with each part of said bifurcation separately bonded to a single circuit element.

3. Microelectronic circuit electrical interconnection elements comprising:

a connecting lead integrally formed upon a microelectronic chip, and a bifurcated extension of said lead, the bifurcated parts of said lead traveling a parallel wave-like path in a plane parallel to the plane of the chip and outwardly from said chip, each of said extended portions being connected to a substrate bonding pad or other circuit lead.

4. Microelectronic circuit interconnecting lead comprising a connecting lead integrally formed upon a microelectronic chip, and a bifurcated extension of said lead extending outwardly in a plane parallel to the chip in two opposite meandering directions and then back, each portion of said extension separately bonded to a single bonding pad or other lead.

References Cited

UNITED STATES PATENTS

| | | | |
|---|---|---|---|
| 3,248,779 | 5/1966 | Yuska et al. | |
| 3,380,016 | 4/1968 | Samson et al. | |
| 3,390,308 | 6/1968 | Marley. | |
| 3,422,213 | 1/1969 | Webb ___________ | 174—71 XR |

DARRELL L. CLAY, Primary Examiner

U.S. Cl. X.R.

174—68.5